(12) United States Patent
    Perthold (10) Patent No.: US 10,050,646 B2
(45) Date of Patent: Aug. 14, 2018

(54) AMPLIFIER ADJUSTING DEVICE, SYSTEM INCLUDING AN AMPLIFIER ADJUSTING DEVICE AND METHOD FOR OPERATING AN AMPLIFIER ADJUSTING DEVICE

(71) Applicant: Innovationszentrum fuer Telekommunikationstechnik GmbH IZT, Erlangen (DE)

(72) Inventor: Rainer Perthold, Weisendorf (DE)

(73) Assignee: Innovationszentrum fuer Telekommunikationstechnik GmbH IZT, Erlangen (DE)

( * ) Notice: Subject to any disclaimer, the term of this patent is extended or adjusted under 35 U.S.C. 154(b) by 0 days.

(21) Appl. No.: 15/617,545

(22) Filed: Jun. 8, 2017

(65) Prior Publication Data
US 2017/0272106 A1    Sep. 21, 2017

Related U.S. Application Data

(63) Continuation of application No. PCT/EP2015/078561, filed on Dec. 3, 2015.

(30) Foreign Application Priority Data

Dec. 8, 2014  (DE) .................. 10 2014 225 148

(51) Int. Cl.
    *H04B 1/00*  (2006.01)
    *H03F 3/19*  (2006.01)
    (Continued)

(52) U.S. Cl.
    CPC ........... *H04B 1/0053* (2013.01); *G01R 23/16* (2013.01); *H03F 3/19* (2013.01); *H03G 3/3052* (2013.01);
    (Continued)

(58) Field of Classification Search
    CPC ...... H04B 1/0053; H04B 3/04; H03G 3/3052; H03F 2200/111; H03F 2200/165; H03F 2200/451
    (Continued)

(56) References Cited

U.S. PATENT DOCUMENTS 4,578,638 A    3/1986    Takano et al.
4,607,215 A    8/1986    Takano et al.
(Continued)

FOREIGN PATENT DOCUMENTS

DE    102011055533 A1    5/2013
DE    102013102432 A1    10/2014
JP    20020214259 A    7/2002

*Primary Examiner* — Sonny Trinh
(74) *Attorney, Agent, or Firm* — Michael A. Glenn; Perkins Coie LLP (57) ABSTRACT

The present invention describes an amplifier adjusting device for an amplifier element which is adjustable as a function of amplification factor and is coupled to a frequency domain selecting element for adjusting at least to frequency domains. The amplifier adjusting device includes a memory in which at least two amplification factors may be stored, the at least two amplification factors being assigned to the two at least two frequency domains, an amplification factor adjusting element configured to select, depending on a current frequency domain, a corresponding amplification factor from the memory in order to adjust the adjustable amplifier element, and an amplification factor estimator configured to correct, based on an analysis of a signal amplified by means of the adjustable amplifier element in accordance with the selected amplification factor, the selected amplification factor and store the corrected amplification factor in the memory.

23 Claims, 4 Drawing Sheets

(51) Int. Cl.
*H03G 3/30* (2006.01)
*G01R 23/16* (2006.01)

(52) U.S. Cl.
CPC .. *H03F 2200/111* (2013.01); *H03F 2200/165* (2013.01); *H03F 2200/451* (2013.01)

(58) Field of Classification Search
USPC .... 455/232.1, 234.1, 127.3, 144, 253.2, 341
See application file for complete search history.

(56) References Cited

U.S. PATENT DOCUMENTS

| | | | | |
|---|---|---|---|---|
| 5,469,127 A * | 11/1995 | Hulick | ................. | H03C 1/00 |
| | | | | 330/10 |
| 8,872,504 B2 * | 10/2014 | Suryan | ................. | G01R 23/16 |
| | | | | 324/76.29 |
| 9,219,457 B2 * | 12/2015 | Su | ................. | H03G 3/002 |
| 2002/0081986 A1 * | 6/2002 | Yokoyama | ................. | H04W 24/00 |
| | | | | 455/234.1 |
| 2009/0027127 A1 * | 1/2009 | Muhammad | ................. | H03F 3/19 |
| | | | | 330/278 |
| 2012/0274309 A1 | 11/2012 | Suryan | | |
| 2014/0294199 A1 | 10/2014 | Otani et al. | | |

\* cited by examiner

AMPLIFIER ADJUSTING DEVICE, SYSTEM INCLUDING AN AMPLIFIER ADJUSTING DEVICE AND METHOD FOR OPERATING AN AMPLIFIER ADJUSTING DEVICE

CROSS-REFERENCE TO RELATED APPLICATIONS

This application is a continuation of copending International Application No. PCT/EP2015/078561, filed Dec. 3, 2015, which claims priority from German Application No. DE 10 2014 225 148.6, filed Dec. 8, 2014, which are each incorporated herein in its entirety by this reference thereto.

BACKGROUND OF THE INVENTION

The present invention relates to an amplifier adjusting device, a system including an amplifier adjusting device and a method for operating an amplifier adjusting device.

In spectrum analyzers, it is customary to perform the amplification adjustment on the basis of a so-called "reference level". This value sets the maximum level control over the entire frequency domain to be searched. Typically, this has the disadvantage that the reference level is determined by the strongest signal within the search range and, thus, comparatively weak signals may be attenuated in an unnecessarily strong manner. A further possible solution for an amplification adjustment is that the receiver performs a measurement for determining the optimum amplification after each adjustment of a new center frequency. Although this is easy to implement (e.g., by means of an ADC (analog-digital converter)), it has the drawback that valid measurement results may not be gained during the control process and, thus, the duration for a scan may be considerably extended under certain circumstances.

SUMMARY

According to an embodiment, a high-frequency receiver for searching a frequency band with at least two frequency domains, wherein searching the frequency band includes switching between the at least two frequency domains; including an amplifier adjusting device for an amplifier element which is adjustable as a function of amplification factor and is coupled to a frequency domain selecting element for adjusting at least two frequency domains, may have: a memory in which at least two amplification factors may be stored, said at least two amplification factors being assigned to the at least two frequency domains; an amplification factor adjusting element configured to select, depending on a current frequency domain, a corresponding amplification factor from the memory in order to adjust the adjustable amplifier element for the current frequency domain; and an amplification factor estimator configured to correct, based on an analysis of a signal amplified by means of the adjustable amplifier element in accordance with the selected amplification factor, the selected amplification factor and to store the corrected amplification factor in the memory; wherein correcting the amplification factors for the current frequency domains includes calculating correction factors adapted in each iteration.

Another embodiment may have a system including an inventive high-frequency receiver, a frequency domain selecting element and an adjustable amplifier element, wherein the frequency domain selecting element divides a signal into a first sub-signal in a first frequency domain and into a second sub-signal in a second frequency domain, wherein the amplifier adjusting device amplifies the first or the second sub-signal in accordance with the amplification factor, wherein the amplifier adjusting device is coupled to the adjustable amplifier element in order to adjust the same with the amplification factor in accordance with the frequency domain selected by the frequency domain selecting element.

Another embodiment may have a method for operating a high-frequency receiver for searching a frequency band with at least two frequency domains, wherein searching the frequency band includes switching between the at least two frequency domains, including an amplifier adjusting device with an amplifier element which is adjustable as a function of amplification factor and is coupled to a frequency domain selecting element for adjusting at least two frequency domains, the operation being characterized by providing at least two amplification factors in a memory, said at least two amplification factors being assigned to the at least two frequency domains; adjusting an adjustable amplifier element in accordance with the amplification factor selected from the memory depending on a current frequency domain for the current frequency domain; and correcting the selected amplification factor based on an analysis of a signal amplified by means of the adjustable amplifier element in accordance with the selected amplification factor, and storing the corrected amplification factor in the memory; wherein correcting the amplification factors for the current frequency domains includes calculating correction factors adapted in each iteration.

Another embodiment may have a non-transitory digital storage medium having a computer program stored thereon to perform the method for operating a high-frequency receiver for searching a frequency band with at least two frequency domains, wherein searching the frequency band includes switching between the at least two frequency domains, including an amplifier adjusting device with an amplifier element which is adjustable as a function of amplification factor and is coupled to a frequency domain selecting element for adjusting at least two frequency domains, the operation being characterized by providing at least two amplification factors in a memory, said at least two amplification factors being assigned to the at least two frequency domains; adjusting an adjustable amplifier element in accordance with the amplification factor selected from the memory depending on a current frequency domain for the current frequency domain; and correcting the selected amplification factor based on an analysis of a signal amplified by means of the adjustable amplifier element in accordance with the selected amplification factor, and storing the corrected amplification factor in the memory; wherein correcting the amplification factors for the current frequency domains includes calculating correction factors adapted in each iteration, when said computer program is run by a computer.

Embodiments provide an amplifier adjusting device for an amplifier element which is adjustable as a function of amplification factor and is coupled to a frequency domain selecting element for adjusting at least two frequency domains. The amplifier adjusting device includes a memory in which at least two amplification factors may be stored, said at least two amplification factors being assigned to the at least two frequency domains. The amplifier adjusting device further includes an amplification factor adjusting element configured to, depending on a current frequency domain, select a corresponding amplification factor from the memory in order to adjust the amplifier element. The amplifier adjusting device further includes an amplification factor estimator configured to, based on an analysis of a signal amplified by means of the amplifier element in accordance with the selected amplification factor, correct the selected amplification factor and store the corrected amplification factor in a memory.

The invention is based on the understanding that an adjustment of an amplifier, e.g., in a signal path, may be optimized with regard to adjusting duration and accuracy by storing different amplifier adjustments for different frequency domains, which may then be constantly updated during the ongoing operation. On this basis, an amplifier adjusting device includes means for an amplifier adjustment based on predetermined amplifier adjusting values which are stored, e.g., in a look-up table, and means for checking and adapting the amplifier adjusting values. Since the amplifier adjusting values are typically different for different frequency domains, the means for an amplifier adjustment and the means for checking and adapting the amplifier adjusting values operate in a frequency-selective manner. Hence, it is possible to operate, starting from the first signal processing, with approximately matching amplifier adjusting values and (e.g., in the sequential analysis of several frequency bands) to update the values for each frequency band in parallel to the further signal processing without adversely affecting the measurement time.

According to an embodiment, a system is configured which includes an amplifier adjusting device, a frequency domain selecting element and an adjustable amplifier element. The frequency domain selecting element may divide a signal into a first sub-signal in a first frequency domain and into a second sub-signal in a second frequency domain. The amplifier adjusting element may be coupled to the adjustable amplifier element in order to adjust the same with the amplification factor in accordance with the frequency domain selected by the frequency domain selecting element.

According to an embodiment, a method for operating an amplifier adjusting device with an amplifier element which is adjustable as a function of amplification and is coupled to a frequency domain selecting element for adjusting at least two frequency domains factor is provided. The operation is characterized by the step of providing at least two amplification factors in a memory, said at least two amplification factors being assigned to the at least two frequency domains. The operation further includes the step of adjusting an amplifier element in accordance with an amplification factor selected from the memory depending on a current frequency domain, and of correcting the selected amplification factor based on an analysis of a signal amplified by means of the amplifier element in accordance with the selected amplification factor, and storing the corrected amplification factor in the memory. According to an embodiment, the method may be executed by a computer program comprising a program code.

According to an embodiment, correcting the amplification factors comprises calculating a correction factor which may be adapted in each iteration. Thus, for calculating the correction factor, correction factors of preceding iterations may be used, e.g., in a time-decreasing weighting. According to further embodiments, the time-decreasing weighting may be achieved with a leaky integrator. Thus, the correction factor may be adapted at will to the requirements of the current application. For example, if a fast adaption to changing signal strengths is desired, fewer or no previous correction factors may be integrated into the calculation of the current correction factor and/or the weighting is selected to be very small.

Further embodiments show the amplifier adjusting device according to any of the preceding claims, wherein the at least two amplification factors are support points in terms of frequency and time for an interpolation function with which the adjustable amplifier element is adjusted. This is advantageous since the embodiment is independent of a fixed frequency raster. Thus, there already is an initial value for an amplification or level control even if there is no measurement value at this frequency for the level control, since this frequency has not yet been adjusted.

BRIEF DESCRIPTION OF THE DRAWINGS

Embodiments of the present invention will be detailed subsequently referring to the appended drawings, in which.

DETAILED DESCRIPTION OF THE INVENTION

In the following description of the figures, identical or functionally identical elements will be provided with identical reference numerals so that a description of the same in different embodiments will be interchangeable.

Figure 1:
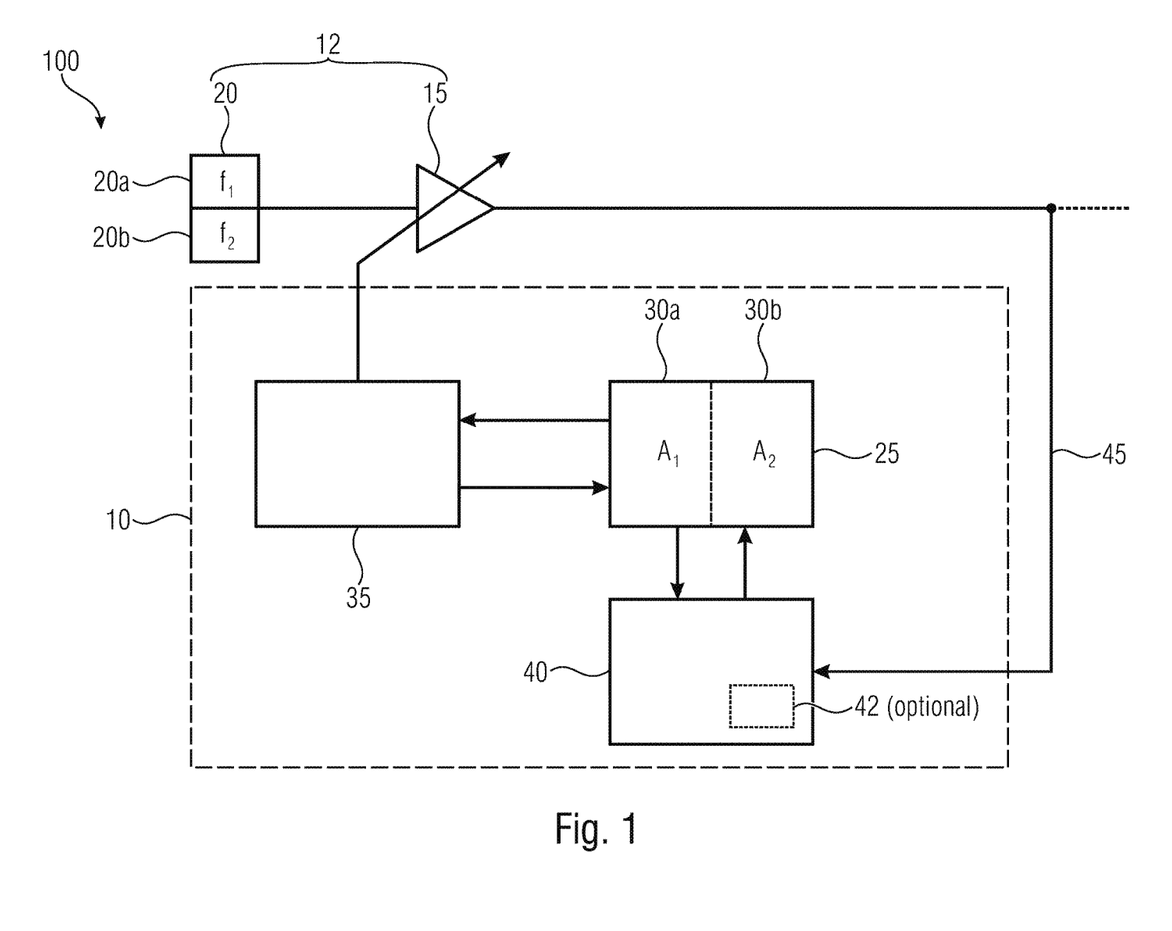
FIG. 1 shows an exemplary signal-flow diagram of an amplifier adjusting device, an adjustable amplifier element and a frequency domain selecting element according to an embodiment.

FIG. 1 shows an exemplary signal-flow diagram of an amplifier adjusting device 10 for a signal amplification path 12.

The signal processor path 12 includes an amplifier element 15 which is adjustable as a function of amplification factor, and a frequency domain selecting element 20 for adjusting at least two frequency domains 20a and 20b, the adjustable amplifier element 15 and the frequency domain selecting element 20 being connected in series. A preselection of the frequency domains f1 or f2 of a signal to be processed by means of the signal amplification path 12 is effected with the frequency domain selecting element 20. In one step during the signal processing, an amplification of the input signal is effected, e.g., such that an analog-digital converter connected downstream may be operated in a "good" level control range. Since typically there are considerable signal energy differences in different frequency domains, this is to be considered accordingly when adjusting the adjustable amplifier element 15.

Therefore, according to the first embodiments, the amplifier adjusting device 10 described below is provided. The amplifier adjusting device 10 includes an amplification factor adjusting element 35, a memory 25 and an amplification factor estimator 40.

The operating principle is as follows: the amplification factor adjusting element 35 and the memory 25 in which at least two amplification factors 30a and 30b may be stored or are already stored, said at least two amplification factors 30a and 30b being assigned to the at least two frequency domains 20a and 20b, are coupled to each other in an informational manner so that the amplification factor adjusting element 35, depending on a current frequency domain of at least the two frequency domains 20a and 20b or a further frequency domain, may select from the memory 25 a corresponding amplification factor, e.g., the amplification factor 30a or 30b or a further amplification factor, so as to adjust the adjustable amplifier element 15.

The amplification factor estimator 40 is configured to correct, based on an analysis of a signal 45 (in short: amplifier signal 45) amplified by means of the adjustable amplifier element 15 in accordance with the selected amplification factor, the selected amplification factor and to store or update the corrected amplification factor again in the memory 25. In detail, the amplification factor estimator 40 reads out an amplification factor from the memory 25, corrects the same and stores the corrected amplification factor in the memory 25. For analyzing the amplification signal, the amplification factor estimator 40 may receive and evaluate an amplifier signal 45 digitalized in the signal amplification path 12 or include an optional analog-digital converter 42 in order to analyze the (analog) amplifier signal 45 after digitalization. The amplification factor estimator 40 may also be viewed as an estimator for the level control of the adjustable amplifier element 15.

In embodiments, the amplification factor estimator 40 may be configured to correct the corrected amplification factor in a further iteration in order to obtain an amplification factor corrected twice. Different correction factors weighted with respect to each other may be used in each iteration. Thus, short and strong changes in the wave form are prevented from influencing the current amplification factor too strongly, for example.

The amplification factor estimator 40 may further be configured to correct the amplification factor in consideration of statistical characteristics in the amplifier signal 45. For example, the statistical characteristics may be stored in a histogram, a mean value or a variance. Furthermore, the amplification factor estimator 40 may be configured to determine the statistical characteristics for correcting the amplification factor from a digital amplifier signal.

Figure 2:
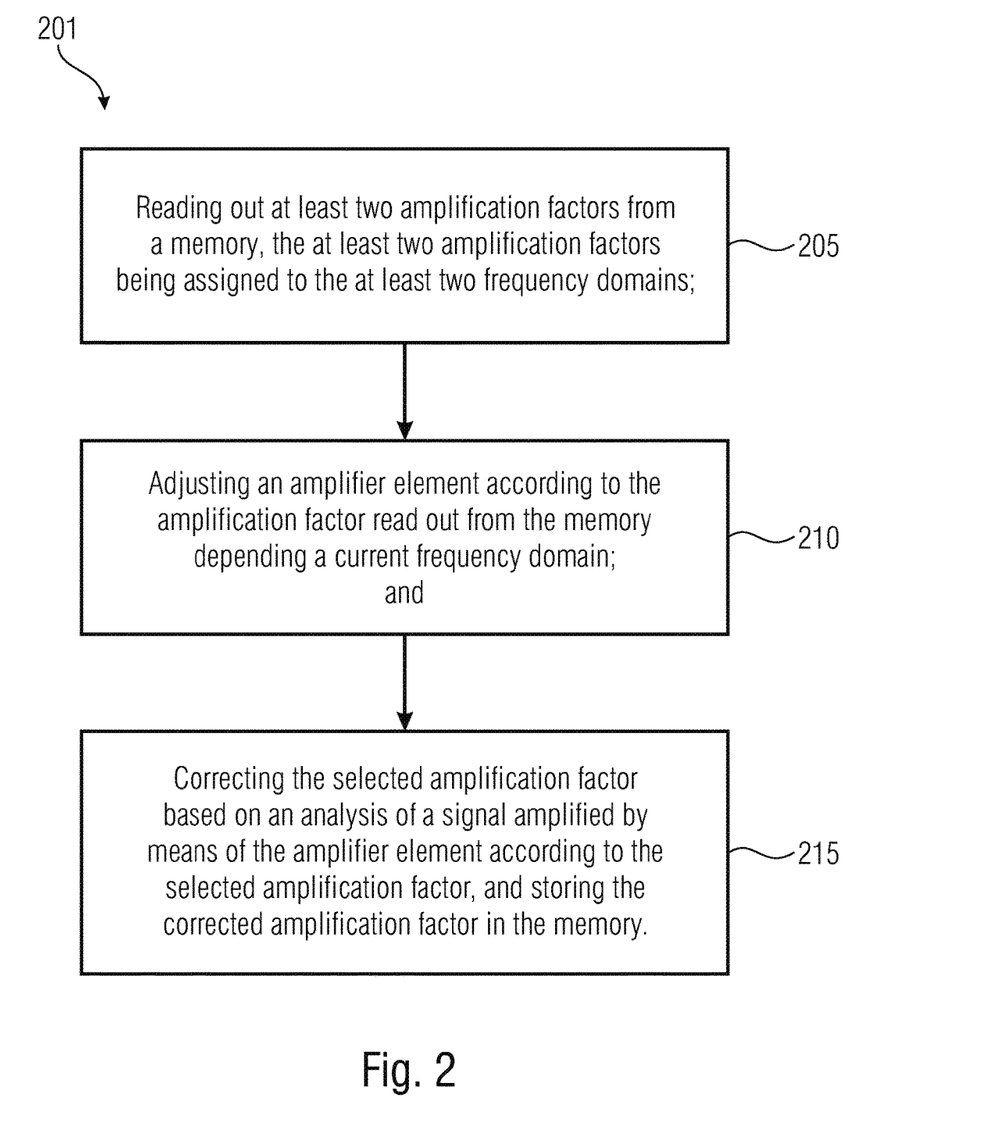
FIG. 2 shows a schematic flow chart of a method for operating an amplifier adjusting device according to an embodiment.

FIG. 2 shows a flow chart of a method 201 for operating an amplifier adjusting device 10. The method 201 includes at least the base steps 205 "reading-out at least two amplification factors from a memory, said at least two amplification factors being assigned to the at least two frequency domains", 210 "adjusting an amplifier element in accordance with the amplification factor read out from the memory depending on a current frequency domain" and 215 "correcting the selected amplification factor based on an analysis of a signal amplified by means of the amplifier element in accordance with the selected amplification factor, and storing the corrected amplification factor in the memory". For example, an implementation of the method may be based on a computer program having a program code.

Figure 3:
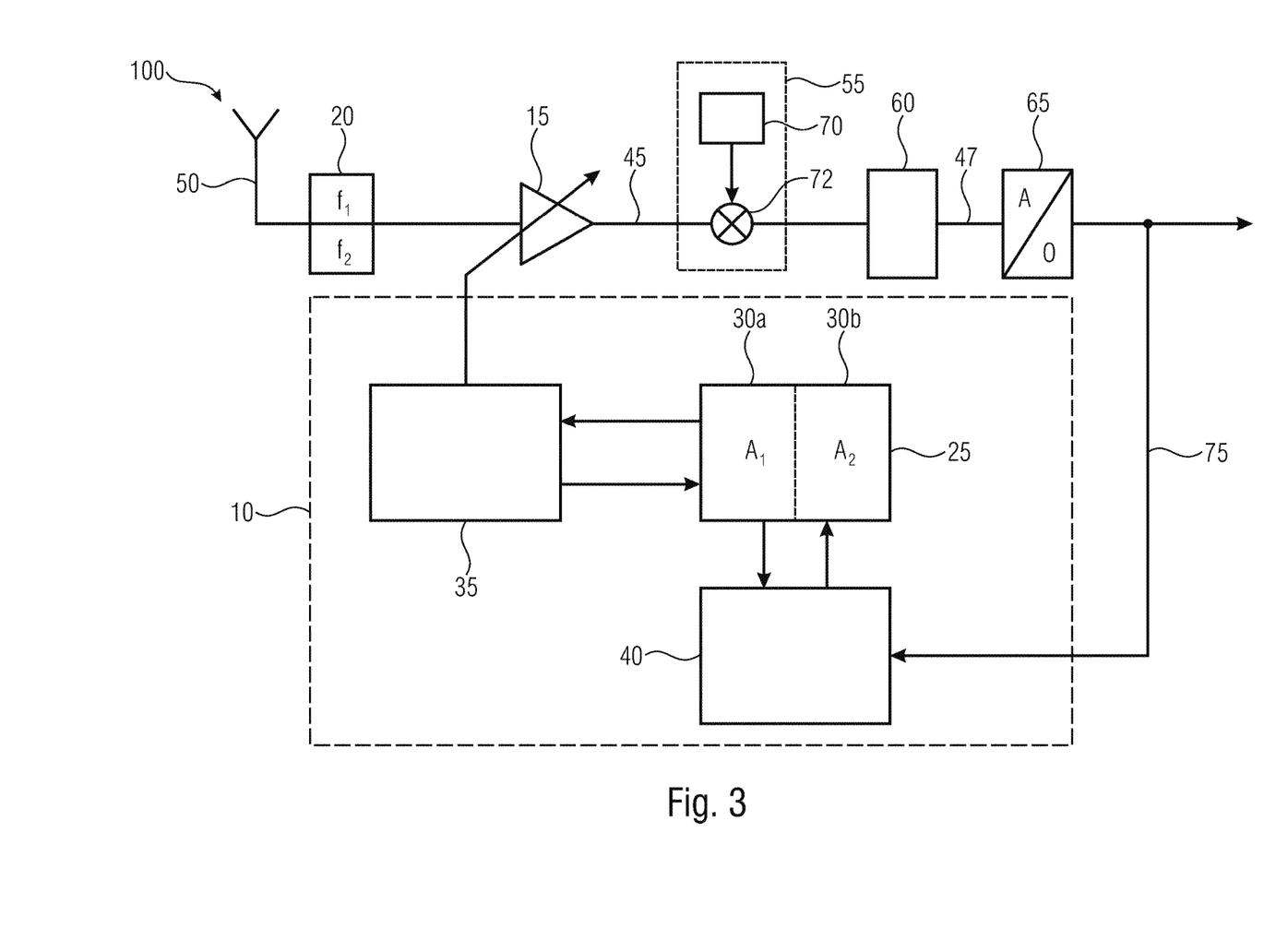
FIG. 3 shows an exemplary signal-flow diagram of an amplifier adjusting device comprising peripheral packages according to an embodiment.

FIG. 3 shows a signal-flow diagram of an amplifier adjusting device comprising peripheral packages according to an embodiment. The peripheral packages may include, e.g., an antenna 50, the frequency domain selecting element 20, the adjustable amplifier element 15, a mixer 55, an optional filter 60 and/or an analog-digital converter 65.

For example, the antenna 50 may receive a signal such as an electromagnetic wave. The electromagnetic wave may be transmitted to the frequency domain selecting element 20 by means of an electrical connection. The frequency domain selecting element 20 may filter the electromagnetic wave with one of the at least two frequency domains 20a, 20b, and, in such a way, isolate a first sub-signal in the first frequency domain 20a or a second sub-signal in the second frequency domain 20b. The adjustable amplifier element 15 may amplify the first or the second sub-signal in accordance with the adjustable amplification factor and, thus, generate the amplifier signal 45.

The mixer 55 may include an isolator 70, e.g., a local oscillator 70 comprising an adjustable frequency, and a mixer 72, e.g., a multiplier or adder, which mixes the amplifier signal and the oscillator signal, i.e., adds or multiples both signals. The modulation may be performed such that the amplifier signal from the current frequency domain, for example, in the range of 1 GHz to 5 GHz, e.g., 3 GHz, is transformed into a new frequency domain, for example, in the range of 100 MHz to 300 MHz, e.g., 240 MHz. The center frequency of the transformed frequency domain may be tuned to the center frequency of the intermediate frequency filter 60. The intermediate frequency filter may be a filter with a fixed center frequency and a fixed bandwidth, which may comprise better filter characteristics than the frequency domain selecting element 20. This may be supported by the modulation of the amplified signal when the amplified signal is modulated in a frequency domain in which a simpler signal processing is possible, e.g., when high frequency effects may be neglected. Furthermore, the intermediate frequency filter 60 may filter out undesired frequencies from the modulated signal, e.g., mirror frequencies occurring after the modulation.

Downstream from the intermediate frequency filter 60, the resulting signal 47 may be digitalized in an analog-digital converter 65. For an optimum conversion of the analog signal into the digital signal, a good level control of the analog-digital converter 65 may be advantageous. Hence, the adjustable amplifier 15 may adapt the minimum and/or maximum amplitude of the amplified signal through the selected amplification factors such that the analog-digital converter is level-controlled in the best possible manner.

For analyzing the digitalized signal, the amplifier adjusting device 10 includes the amplification factor estimator 40. The same may analyze the digital signal 75 and determine from the digital signal 75, e.g., statistical parameters such as the mean value, the median, a histogram or the variance. From the statistical characteristics of the digital signal, a correction factor for the amplification factors 30a or 30b or an optional further amplification factor may be determined.

Apart from the current amplification factors, further amplification factors from previous iteration steps may be stored in the memory 25, which may be realized, e.g., as a type of look-up table including the multitude of the amplification factors for the multitude of the possible frequency domains. If the amplification factors from preceding iteration steps or the change to the amplification factors from preceding iteration steps are in the memory 25, the amplification factor estimator 40 may incorporate, e.g., the preceding amplification factors or the change of the preceding amplification factors in forming the current amplification factor. For example, this may be achieved by means of a descending weighting of the preceding amplification factors, i.e., the amplification factor from the preceding iteration step may be weighted more heavily than an amplification factor from a preceding iteration step. For example, this weighting may be achieved by means of a leaky integrator, a linearly weighted sliding mean value or an exponentially smoothed mean value.

Furthermore, a maximum amplification may be selected as a starting value. At this time, current amplification factors may not be present in the memory. Accordingly, a weighted adaption of the amplification factor in accordance with the preceding amplification factors is not possible. This may result in a larger jump of the amplification factor as compared to when the preceding amplification factors may exert a smoothing influence onto the adaption of the amplification factor at a later point in time.

The adjustable amplifier element 15 may be realized, e.g., by a transistor or a transistor stage. For example, the amplification factor may be a digital value to which a bias voltage for the amplifier element 15 is assigned. The selection of the current frequency domain is effected by means of a frequency domain adjusting element. The same may predetermine the frequency domain in the frequency domain selecting element 20, the oscillation frequency of the local oscillator 70 and the current frequency domain in the amplification factor adjusting element 35. Hence, a synchronization of the amplification factors may be ensured.

Figure 4A:
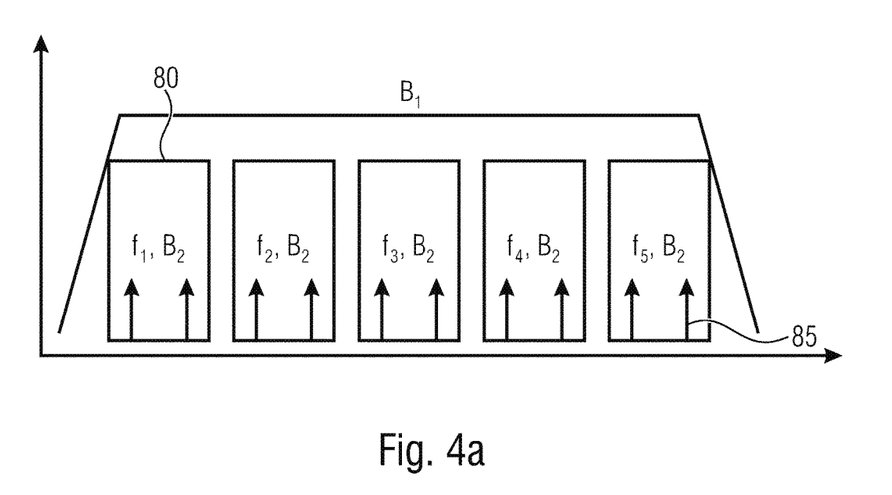
FIG. 4a shows a schematic chart of a frequency domain which is sub-divided into five differently amplified sub-domains for illustrating an amplification with a constant amplification factor.
Figure 4B:
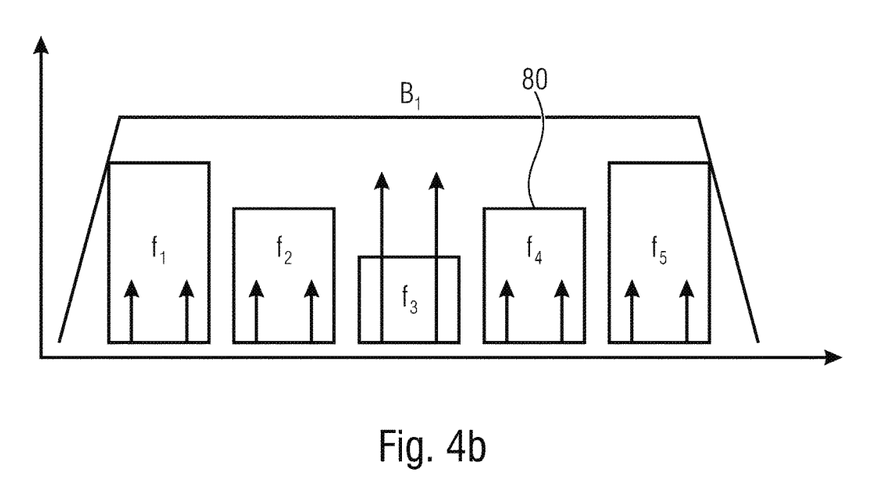
FIG. 4b shows a schematic chart of a frequency domain which is subdivided into five differently amplified sub-domains for illustrating an amplification with a variable amplification factor.

FIGS. 4a and 4b show schematic charts in a frequency illustration, which illustrate a frequency domain B1 divided into five frequency domains 80. In these charts, each frequency domain 80 is characterized by a center frequency f1-f5 and a bandwidth B2. The center frequencies f1 and f2 may correspond to the at least two frequency domains 20a and 20b. Further, the frequency domains having the center frequencies f3-f5 may characterize further frequency domains so that, e.g., a frequency domain selecting element with a filter bank of five filters may generate such a result. The bandwidth B1 may correspond to the operating range of the amplifier adjusting device 10. Within the frequency bands 80, the arrows 85 schematically indicate the strength of the frequencies contained in the frequency domain.

In FIG. 4a, the arrows comprise a similar length throughout, as a result of which no characteristic occurring frequencies are present in a frequency band in this scheme. The amplification may be the same in all frequency domains, e.g., the maximum possible amplification may be selected. However, the amplification may be adapted so as to avoid overdriving of the analog-digital converter. The adaptation may be effected by means of the amplifier adjusting device which, for example, analyzes the digital signal after the analog-digital converter and increases the amplification or the amplification factor when the analog-digital converter is operated under its optimum level control range, and decreases the same when the analog-digital converter is operated above its optimum level control range. As described above, the correction may be effected dynamically by the amplifier adjusting device.

FIG. 4b shows an accumulation of characteristic frequencies in the frequency domain of the center frequency f3, which are described by long arrows 85. Here, it may be advantageous to less heavily amplify not only the frequency domain around the center frequency f3 but also the adjacent frequency domains. This may be due to the occurrence of nonlinearities in the analog stages, e.g., the mixer, the intermediate frequency filter or the analog-digital converter. For example, undesired intermodulation products in a frequency domain may cross-talk into the neighbouring frequency domains. If greatly differing amplification factors are used for adjacent frequency domains, the intermodulation products may also be amplified disproportionately heavily in comparison to the useful signal. Therefore, the amplification factor estimator may be configured to change the at least two amplification factors assigned to two successive frequency domains by no more than a predefined factor.

Furthermore, due to the nonlinearities, e.g., at high input powers, a so-called blocking (compression) may develop if the total signal energy in the operating range of the amplifier adjusting device exceeds an application-dependent limit value. In order to counteract the blocking, the amplification factor estimator may be configured to limit the at least two amplification factors to a predetermined multiple of an amplification factor of a sub-signal with the greatest signal power.

A pre-selection among analog bandpass filters (usually realized as a filter bank with fixed-frequency or tunable filters), which is typically present in receivers, may serve for reducing the signal energy as far as possible in front of the actual intermediate-frequency filter. For example, a receiver may include an antenna input, an analog filter (pre-selector) with a bandwidth B1, a stage with an adjustable amplification, a frequency converter (e.g. weakly non-linear), an intermediate frequency filter with the bandwidth B2 and an analog-digital converter. In this case, the bandwidth B1 is generally significantly greater than the bandwidth B2. In the example of FIGS. 4a and 4b, the following is selected: B1=5*B2. For simplicity, it may further be assumed that the bandwidth B2 is covered by five segments with the center frequencies f1-f5. If the bandwidth B2 is only occupied by weak signals in all segments, the maximum available amplification may be selected in each segment (see FIG. 4a).

In addition to the level control of the analog-digital converter (which is determined only by the amplification within the active segment), nonlinearities in the analogue stages located in front thereof may also determine the large signal behavior of the receiver, primarily by intermodulation products of the second and third order, but also by blocking (compression) at very high input powers. From this, the following conditions may be derived for the selection of a suitable amplification.

Blocking may occur when the total signal energy within B1 becomes too large. The spectral distribution is only of secondary importance. Thus, the amplification of each segment with the largest signal power may not be exceeded by more than a certain factor in any segment within B1. This factor depends on the concrete implementation.

Intermodulations of the third order generally occur before blocking is recognizable. Here, it may be assumed that the intermodulating signals may be located within a segment (e.g., f3 in FIG. 4b). Thus, the intermodulation products of the third order may respectively fall into the neighboring segments (i.e., f2 and f4) (c.f., FIG. 4b). Accordingly, the amplification may not vary too heavily between neighboring segments.

Therefore, too high of an amplification in a segment with a low signal power may result in degradation of the reception quality since the pre-stage may be overdriven by strong signals in other segments within B2. By linking the measurement values of several segments and recognizing the analog filters possibly present in the receiver, the intermodulation products to be expected may be predicted. If applicable, the amplification in the currently active affected segment may be reduced.

With regard to FIG. 1, it should also be noted that the device 10, in combination with the signal amplification path 12, forms a system which is configured to amplify, e.g., a high-frequency signal, the amplification factor being calculated by the device 10.

The present invention may be applied to high-frequency receivers which are intended to quickly search a wide frequency domain for signals with respect to their real-time bandwidth. The searching may be effected in that the center frequency of the receiver is switched in rapid succession and a number of line density spectra may be recorded at each frequency (scan). Here, it may be particularly advantageous to find a suitable adjustment for the amplification between the antenna input and the analog-digital converter, said amplification optimally controlling the level of the analog-digital converter and reliably avoiding overdrives by controls in the analog-digital converter or the analog part preceding it. Depending on the adjusted center frequency, the optimum amplification may generally be different and also fluctuate over time. Given a sufficiently large real-time bandwidth of the receiver, the frequency-dependent fluctuations may be significantly greater than the time-dependent fluctuations, for example, during stationary use. With the above concept, an optimal adjustment of the amplification of such a receiver is made possible without lengthening the time that may be used for a scan. In other words, embodiments provide, for each center frequency or at least two segments of the scanning area, a respective storage (for example a memory) containing the optimum amplification for this frequency domain. It is updated with each sweep (iteration). The memory may be held not only as a mean value, but may also contain information on the statistical distribution (e.g., histogram, mean value and variance, etc.). The measured variable may be the maximum level control of the analog-digital converter within a time interval.

According to alternative embodiments, the effect of a measurement value on the storage may decrease with time, which may be achieved by sliding averaging or by a feedback structure (e.g., a Leaky integrator). From the mean value and, if available, the statistical distribution, the optimum amplification may be determined and adjusted for the current sweep and the currently set frequency.

Further embodiments show the amplifier adjusting device according to any of the preceding claims, wherein the at least two amplification factors $30a$, $30b$ are support points in terms of frequency and time for an interpolation function with which the adjustable amplifier element $15$ is adjusted. The support points of the amplification factor (or of the level control, since both may be converted into one another) are based on the measurements of the amplification factor estimator $40$ (which may also be regarded as an estimator for the modulation). For example, the mathematical interpolation function placed by the support points is a regression polynomial, a regression spline or a constrained cubical. By parameterizing the interpolation function it is achieved that the desired and already described boundary conditions (e.g., no large-scale jumps in the amplification between neighbouring frequency portions) are taken into account. Furthermore, old support points may be deleted if sufficient support points are located within a frequency portion. The advantage of this embodiment is that it is independent of a fixed frequency raster. Thus, an initial value for an amplification or a modulation is already present, even if there is still no measured value for the level control at exactly this frequency since this frequency has not yet been adjusted.

According to an embodiment, the amplifier adjusting element and the associated components are configured in a switchable manner such that frequency domains in a frequency band may be searched for, in one pass or one iteration (sweep), occurring or present signals or signal portions. Here, iteration describes a (complete) pass of the frequency band or a pass of (all) frequency domains defined in the frequency band. Thus, in a first step, a first frequency domain may be searched or scanned so that signal portions present in the frequency domain are received and amplified in accordance with the stored associated amplification factor. While a second frequency domain, which is advantageously different from the first frequency domain, is already being searched, the amplified first signal may be analyzed. For example, based on a level control of an optional analog-digital converter, the amplification factor may be corrected and stored in a corrected or adapted manner in the memory. At the same time, a signal portion in the second searched frequency domain may have been received and amplified. While another frequency domain is searched or the first frequency domain is searched again, the amplified signal may also be analyzed for the second frequency domain and the amplification factor may be corrected based on the analyzed signal and stored in the memory. If no further frequency domains are present, or if all frequency domains have been scanned, the sub-signal received during the correction of the second or the preceding amplification factor from the first frequency domain is amplified with the amplification factor corrected twice which is determined after the previous measurement of the amplified sub-signal from the first frequency domain. Now, the signal amplified with the amplification factor corrected twice is analyzed and the amplification factor corrected twice is adapted based on the analyzed signal and a correction factor corrected three times is stored in the memory.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed while using a hardware device, such as a microprocessor, a programmable computer or an electronic circuit. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier.

In other words, an embodiment of the inventive method thus is a computer program which has a program code for performing any of the methods described herein, when the computer program runs on a computer. The data carrier, the digital storage medium, or the recorded medium are typically tangible, or non-volatile.

A further embodiment of the inventive methods thus is a data carrier (or a digital storage medium or a computer-readable medium) on which the computer program for performing any of the methods described herein is recorded.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing means, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU), or may be a hardware specific to the method, such as an ASIC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A high-frequency receiver for searching a frequency band with at least two frequency domains, wherein searching the frequency band comprises switching between the at least two frequency domains; comprising an amplifier adjusting device for an amplifier element which is adjustable as a function of amplification factor and is coupled to a frequency domain selecting element for adjusting at least two frequency domains, comprising:
a memory in which at least two amplification factors may be stored, said at least two amplification factors being assigned to the at least two frequency domains;
an amplification factor adjusting element configured to select, depending on a current frequency domain, a corresponding amplification factor from the memory in order to adjust the adjustable amplifier element for the current frequency domain; and
an amplification factor estimator configured to correct, based on an analysis of a signal amplified by means of the adjustable amplifier element in accordance with the selected amplification factor, the selected amplification factor and to store the corrected amplification factor in the memory;
wherein correcting the amplification factors for the current frequency domains comprises calculating correction factors adapted in each iteration.

2. The high-frequency receiver according to claim 1, wherein the amplification factor estimator is configured to correct the corrected amplification factor in accordance with a current frequency domain in a further iteration in order to acquire an amplification factor corrected twice.

3. The high-frequency receiver according to claim 1, wherein the frequency domains of the high-frequency receiver are switched in rapid succession in an iteration in order to search each frequency domain of the frequency band for signals.

4. The high-frequency receiver according to claim 1, wherein the amplification factor adjusting element is configured to select differing amplification factors from the memory for neighbouring frequency domains in order to satisfy the changing signal strengths.

5. The high-frequency receiver according to claim 1, wherein the amplification factor estimator is configured to sequentially analyze the amplified signals from the frequency domains and to calculate the corrected amplification factor for an amplified signal from the first frequency domain, the adjustable amplifier element being configured to amplify a signal from the second frequency domain during the analysis.

6. The high-frequency receiver according to claim 2, wherein the amplification factor estimator is configured to use different correction factors for each iteration, which are weighted with respect to each other.

7. The high-frequency receiver according to claim 6, wherein the amplification factor estimator comprises a leaky integrator configured to calculate an amplification factor corrected multiple times, decreasing correction factors being used for each iteration.

8. The high-frequency receiver according to claim 1, wherein the amplification factor estimator is configured to correct the amplification factor in consideration of statistical characteristics in the signal amplified with the selected amplification factor.

9. The high-frequency receiver according to claim 8, wherein the statistical characteristics are stored in a histogram, a mean value or a variance.

10. The high-frequency receiver according to claim 1, wherein the amplification factor estimator is configured to read out an amplification factor from the memory, to correct the same and to store a corrected amplification factor in the memory.

11. The high-frequency receiver according to claim 1, wherein the amplification factor estimator is configured to change the at least two amplification factors assigned to two subsequent frequency domains by a preset factor.

12. The high-frequency receiver according to claim 1, wherein the amplification factor estimator is configured to limit the at least two amplification factors to a preset multiple of an amplification factor of a sub-signal with the largest signal power.

13. The high-frequency receiver according to claim 1, wherein the at least two amplification factors are support points in terms of frequency and time for an interpolation function with which the adjustable amplifier element is adjusted.

14. The high-frequency receiver according to claim 1, wherein the amplifier adjusting device comprises a digital-analog converter.

15. A system comprising a high-frequency receiver according to claim 1, a frequency domain selecting element and an adjustable amplifier element,
   wherein the frequency domain selecting element divides a signal into a first sub-signal in a first frequency domain and into a second sub-signal in a second frequency domain,
   wherein the amplifier adjusting device amplifies the first or the second sub-signal in accordance with the amplification factor,
   wherein the amplifier adjusting device is coupled to the adjustable amplifier element in order to adjust the same with the amplification factor in accordance with the frequency domain selected by the frequency domain selecting element.

16. The system according to claim 15, wherein the frequency domain selecting element is configured to select the first and second frequency domains in an alternating manner.

17. The system according to claim 15, wherein the frequency domain selecting element is composed of one or several bandpass filters or one or several sub-octave filters.

18. The system according to claim 15, wherein the system comprises an analog-digital converter configured to digitalize the signal amplified in accordance with the selected amplification factor.

19. The system according to claim 18, wherein the amplification factor is selected such that the amplification factor is corrected downwards when the analog-digital converter overdrives, and is corrected upwards when the analog-digital converter underdrives.

20. The system according to claim 15, wherein the system comprises a mixer configured to modulate the signal amplified in accordance with the selected amplification factor and to shift the same into the current frequency domain.

21. The system according to claim 20, wherein the mixer comprises a mixer and a local oscillator.

22. A method for operating a high-frequency receiver for searching a frequency band with at least two frequency domains, wherein searching the frequency band comprises switching between the at least two frequency domains, comprising an amplifier adjusting device with an amplifier element which is adjustable as a function of amplification factor and is coupled to a frequency domain selecting element for adjusting at least two frequency domains, the operation comprising:
   providing at least two amplification factors in a memory, said at least two amplification factors being assigned to the at least two frequency domains;
   adjusting an adjustable amplifier element in accordance with the amplification factor selected from the memory depending on a current frequency domain for the current frequency domain; and
   correcting the selected amplification factor based on an analysis of a signal amplified by means of the adjustable amplifier element in accordance with the selected amplification factor, and storing the corrected amplification factor in the memory;
   wherein correcting the amplification factors for the current frequency domains comprises calculating correction factors adapted in each iteration.

23. A non-transitory digital storage medium having a computer program stored thereon to perform the method for operating a high-frequency receiver for searching a frequency band with at least two frequency domains, wherein searching the frequency band comprises switching between the at least two frequency domains, comprising an amplifier adjusting device with an amplifier element which is adjustable as a function of amplification factor and is coupled to a frequency domain selecting element for adjusting at least two frequency domains, the operation comprising:
   providing at least two amplification factors in a memory, said at least two amplification factors being assigned to the at least two frequency domains;
   adjusting an adjustable amplifier element in accordance with the amplification factor selected from the memory depending on a current frequency domain for the current frequency domain; and
   correcting the selected amplification factor based on an analysis of a signal amplified by means of the adjustable amplifier element in accordance with the selected amplification factor, and storing the corrected amplification factor in the memory;
   wherein correcting the amplification factors for the current frequency domains comprises calculating correction factors adapted in each iteration,
   when said computer program is run by a computer.

* * * * *